United States Patent
Mei et al.

(10) Patent No.: US 12,527,157 B2
(45) Date of Patent: *Jan. 13, 2026

(54) LIGHT-EMITTING DEVICE AND METHOD OF MANUFACTURING THE SAME, LIGHT-EMITTING SUBSTRATE AND METHOD OF MANUFACTURING THE SAME, AND LIGHT-EMITTING APPARATUS

(71) Applicant: BOE TECHNOLOGY GROUP CO., LTD., Beijing (CN)

(72) Inventors: Wenhai Mei, Beijing (CN); Yichi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/602,672

(22) Filed: Mar. 12, 2024

(65) Prior Publication Data
US 2024/0224573 A1 Jul. 4, 2024

Related U.S. Application Data

(63) Continuation of application No. 17/427,582, filed as application No. PCT/CN2020/116460 on Sep. 21, 2020, now Pat. No. 11,968,852.

(51) Int. Cl.
*H10K 50/16* (2023.01)
*H10K 50/11* (2023.01)
(Continued)

(52) U.S. Cl.
CPC ............ *H10K 50/16* (2023.02); *H10K 50/11* (2023.02); *H10K 50/165* (2023.02); *H10K 59/35* (2023.02);
(Continued)

(58) Field of Classification Search
CPC ...... H10K 50/16; H10K 50/165; H10K 50/11; H10K 59/35; H10K 71/00; H10K 50/115;
(Continued)

(56) References Cited

U.S. PATENT DOCUMENTS

2008/0007164 A1* 1/2008 Suzuki .................. H10K 50/18
313/504
2009/0045728 A1* 2/2009 Murano ............... H10K 50/155
313/504
(Continued)

FOREIGN PATENT DOCUMENTS

| CN | 102651317 A | 8/2012 |
|---|---|---|
| CN | 104241540 A | 12/2014 |

(Continued)

OTHER PUBLICATIONS

International Search Report and Written Opinion for the PCT Application No. PCT/CN2020/116460 by the International Searching Authority on May 26, 2021.
(Continued)

*Primary Examiner* — S M Sohel Imtiaz
(74) *Attorney, Agent, or Firm* — XSENSUS LLP

(57) ABSTRACT

A light-emitting device includes: a first electrode and a second electrode that are superposed; a light-emitting layer (EML) located between the first electrode and the second electrode; and an electron transport layer (ETL) located between the first electrode and the EML. The ETL includes a first surface proximate to the EML and a second surface proximate to the first electrode, the ETL includes oxygen vacancies, and a concentration of oxygen vacancies in the first surface is greater than a concentration of oxygen vacancies in the second surface.

20 Claims, 8 Drawing Sheets

(51) Int. Cl.
  H10K 50/165 (2023.01)
  H10K 59/35 (2023.01)
  *H10K 50/115* (2023.01)
  *H10K 59/12* (2023.01)
  *H10K 71/00* (2023.01)
  *H10K 101/00* (2023.01)
  *H10K 101/30* (2023.01)
  *H10K 101/40* (2023.01)
  *H10K 102/00* (2023.01)

(52) U.S. Cl.
  CPC ........ *H10K 50/115* (2023.02); *H10K 59/1201* (2023.02); *H10K 71/00* (2023.02); *H10K 2101/30* (2023.02); *H10K 2101/40* (2023.02); *H10K 2101/80* (2023.02); *H10K 2102/00* (2023.02); *H10K 2102/331* (2023.02)

(58) Field of Classification Search
  CPC ........... H10K 59/1201; H10K 2101/30; H10K 2101/40; H10K 2101/80
  See application file for complete search history.

(56) References Cited

U.S. PATENT DOCUMENTS

| | | | | |
|---|---|---|---|---|
| 2012/0199837 | A1* | 8/2012 | Kobayashi | H10K 50/155 257/59 |
| 2014/0159031 | A1* | 6/2014 | Aonuma | H10K 50/165 438/46 |
| 2015/0144894 | A1* | 5/2015 | Jiao | H10K 85/381 257/40 |
| 2017/0117480 | A1* | 4/2017 | Oh | H10K 50/11 |
| 2019/0296257 | A1* | 9/2019 | Palles-Dimmock | H10K 50/16 |
| 2021/0036065 | A1* | 2/2021 | Adamovich | H10K 50/156 |
| 2021/0167312 | A1* | 6/2021 | Akiyama | H10K 50/11 |
| 2021/0202875 | A1* | 7/2021 | Park | H10K 50/15 |
| 2022/0093873 | A1* | 3/2022 | Kim | C07D 251/24 |
| 2022/0123060 | A1* | 4/2022 | Kang | H10K 50/15 |

FOREIGN PATENT DOCUMENTS

| | | |
|---|---|---|
| CN | 105514291 A | 4/2016 |
| CN | 106409995 A | 2/2017 |
| EP | 2787527 A1 | 10/2014 |
| EP | 3190639 A1 | 7/2017 |

OTHER PUBLICATIONS

The effect of O content in MoOx film on the performance of green light OLED devices, Science & Technology Information, 2014, No. 23, pp. 99-100, Available at DOI:10.16661/j.cnki. 1672-3791.2014.23.081.

Notice of Allowance for the U.S. Appl. No. 17/427,582 issued by the USPTO on Dec. 27, 2023.

* cited by examiner

LIGHT-EMITTING DEVICE AND METHOD OF MANUFACTURING THE SAME, LIGHT-EMITTING SUBSTRATE AND METHOD OF MANUFACTURING THE SAME, AND LIGHT-EMITTING APPARATUS

CROSS-REFERENCE TO RELATED APPLICATIONS

This application is a continuation of U.S. patent application Ser. No. 17/427,582, filed on Jul. 30, 2021, which claims priority to International Patent Application No. PCT/CN2020/116460, filed on Sep. 21, 2020, which are incorporated herein by reference in their entirety.

TECHNICAL FIELD

The present disclosure relates to the field of illumination and display technologies, and in particular, to a light-emitting device and a method of manufacturing the same, a light-emitting substrate and a method of manufacturing the same, and a light-emitting apparatus.

BACKGROUND

Compared with organic light-emitting diode (OLED) devices, quantum dot light-emitting diode (QLED) devices have advantages of higher theoretical luminous efficiency, adjustable color, wider color gamut, better color saturation and vividness, lower energy consumption, lower cost, etc.

SUMMARY

In one aspect, a light-emitting device is provided. The light-emitting device includes: a first electrode and a second electrode that are superposed; a light-emitting layer (EML) located between the first electrode and the second electrode; an electron transport layer (ETL) located between the first electrode and the EML, the ETL including a first surface proximate to the EML and a second surface proximate to the first electrode, and the ETL including oxygen vacancies, where a concentration of oxygen vacancies in the first surface is greater than a concentration of oxygen vacancies in the second surface.

In some embodiments, a concentration of the oxygen vacancies in the ETL gradually increases from the second surface to the first surface.

In some embodiments, a lowest unoccupied molecular orbital (LUMO) energy level of the first surface of the ETL is lower than a LUMO energy level of the second surface of the ETL. An energy level difference between a LUMO energy level of the EML and the LUMO energy level of the first surface of the ETL is greater than 0 and less than or equal to 0.25 eV. An energy level difference between the LUMO energy level of the second surface of the ETL and a Fermi energy level of the first electrode is greater than 0 and less than or equal to 0.25 eV.

In some embodiments, in the ETL, a percentage of a number of oxygen vacancies in a number of lattice sites of oxygen atoms is in a range of 5% to 50% within a thickness range of 0 nm to 1 nm from the first surface. In the ETL, a percentage of a number of oxygen vacancies in a number of lattice sites of oxygen atoms is in a range of 5% to 20% within a thickness range of 0 nm to 1 nm from the second surface.

In some embodiments, a concentration gradient X of oxygen vacancies in the ETL is represented by an amount of change in a percentage of a number of oxygen vacancies in a total number of lattice sites of oxygen atoms in a thickness of two adjacent 1 nm in the ETL, and a value range of X satisfies a condition that X is greater than 0 and less than or equal to 0.9%.

In some embodiments, the ETL includes a metal oxide nanomaterial and at least one ligand bound to a metal atom in the metal oxide nanomaterial. Each ligand is coordinated to one metal atom through at least one coordination group. A concentration of coordination group in the ETL gradually decreases from the second surface to the first surface.

In some embodiments, the metal oxide nanomaterial includes magnesium-doped zinc oxide, and a doping amount of magnesium in zinc oxide is in a range of 5% to 40%.

In some embodiments, the EML is made of a quantum dot luminescent material.

In another aspect, a light-emitting substrate is provided. The light-emitting substrate includes: a base; a plurality of light-emitting devices disposed on the base. At least one light-emitting device is the light-emitting device as described above, and a second electrode of each light-emitting device is proximate to the base than a first electrode thereof.

In yet another aspect, another light-emitting substrate is provided. The light-emitting substrate includes: a base; a plurality of light-emitting devices disposed on the base. At least one light-emitting device includes a first electrode, a second electrode, a light-emitting layer (EML), and an electron transport layer (ETL). The first electrode and the second electrode are superposed, and the first electrode is closer to the base than the second electrode. The EML is located between the first electrode and the second electrode. The ETL is located between the first electrode and the EML, the ETL includes a first surface proximate to the EML and a second surface proximate to the first electrode, and the ETL includes oxygen vacancies. A concentration of oxygen vacancies in the first surface is greater than a concentration of oxygen vacancies in the second surface.

In some embodiments, the at least one light-emitting device includes at least two types of light-emitting devices with at least two emission colors, and each type of light-emitting devices emit light of one color. A material of each ETL of the at least two types of light-emitting devices includes magnesium-doped zinc oxide. Doping amounts of magnesium in zinc oxide are same or different in ETLs of light-emitting devices with different emission colors.

In some embodiments, the doping amount of magnesium in zinc oxide are same in the ETLs of the light-emitting devices with the different emission colors, and/or concentrations of oxygen vacancies at least in first surfaces of the ETLs are different.

In some embodiments, a doping amount of magnesium in zinc oxide is in a range of 5% to 40%, and/or for the light-emitting devices with different emission colors, concentrations of oxygen vacancies of the ETLs are different.

In some embodiments, the light-emitting substrate further includes a pixel defining layer and a film having electron transmission function located on a side of the pixel defining layer away from the base, and the pixel defining layer has a plurality of openings. The film having electron transmission function includes a portion located in each opening and a portion covering the pixel defining layer except for the openings. The portion of the film having electron transport function located in each opening serves as the ETL, and a LUMO energy level of the portion of the film having electron transport function covering the pixel defining layer except for the openings is higher than a LUMO energy level of a surface of the ETL away from the base.

In yet another aspect, a light-emitting apparatus is provided, including the light-emitting device as described above or the light-emitting substrate as described above.

In yet another aspect, a method of manufacturing the light-emitting device is provided. The method includes:

forming an electron transport layer (ETL) on a first electrode, oxygen vacancies being formed in the ETL, and a concentration of oxygen vacancies in a first surface being greater than a concentration of oxygen vacancies in a second surface, in which the first surface is a surface of the ETL away from the first electrode, and the second surface is a surface of the ETL proximate to the first electrode; forming a light-emitting layer (EML) on a side of the ETL away from the first electrode; and forming a second electrode at a side of the EML away from the ETL.

In some embodiments, forming the ETL on the first electrode, includes: forming a film having electron transport function on the first electrode, and bombarding the film having electron transport function for a preset duration by using plasma from a side of the film having electron transport function away from the first electrode, so as to form the oxygen vacancies in the film having electron transport function to obtain the ETL.

In yet another aspect, a method of manufacturing a light-emitting substrate is provided. The method includes: forming a plurality of light-emitting devices on a base. At least one light-emitting device is the light-emitting device as described above, and the first electrode of the light-emitting device is closer to the base than the second electrode thereof.

In some embodiments, the plurality of light-emitting devices include N types of light-emitting devices with different emission colors, and N is an integer greater than or equal to 2. And forming the plurality of light-emitting devices on the base, includes:

forming a plurality of first electrodes on the base; forming a film having electron transport function on the base on which the plurality of first electrodes have been formed; forming an I-th mask on the base on which the film having electron transport function has been formed, the I-th mask exposing portions of the film having the electron transport function located in regions where an I-th type of light-emitting devices are located, and covering a portion of the film having the electron transport function located in a region except the regions where the I-th type of light-emitting devices are located; bombarding the portions of the film having the electron transport function located in the regions where the I-th type of light-emitting devices are located for an I-th duration by using plasma from a side of the film having the electron transport function away from the base, so that oxygen vacancies are formed in the portions of the film having the electron transport function located in the regions where the I-th type of light-emitting devices are located to obtain I-th ETLs; forming I-th EMLs on a side of the I-th ETLs away from the base; and removing the I-th mask. I is greater than or equal to 1 and less than or equal to N.

In some embodiments, a LUMO energy level of the portions of the film having electron transport function covering the regions where the I-th type of light-emitting devices are located is higher than a LUMO energy level of the I-th EMLs, and a LUMO energy level of surfaces of the I-th ETLs away from the base is lower than the LUMO energy level of the I-th EMLs.

In some embodiments, forming the I-th mask on the base on which the film having the electron transport function has been formed, includes: sequentially forming a sacrificial film and a photoresist film on the base on which the film having the electron transport function has been formed; removing portions of the photoresist film covering the regions where the I-th type of light-emitting devices are located through exposure and development to obtain a photoresist layer; bombarding the base on which the second photoresist layer has been formed by using plasma, so as to remove portions of the sacrificial film covering the regions where the I-th type of light-emitting devices are located, and to obtain the I-th mask including the photoresist layer and a sacrificial layer. Bombarding the portions of the films having the electron transport function located in the region where the I-th type of light-emitting devices are located for the I-th duration by using plasma from the side of the film having the electron transport function away from the base, includes: continuously bombarding the base for the I-th duration after removing the portions of the sacrificial film covering the regions where the I-th type of light-emitting devices are located, so as to form the I-th ETLs in the regions where the I-th type of light-emitting devices are located.

In some embodiments, a value of I is different, and the I-th duration is different.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual dimensions of products, actual processes of methods and actual timings of signals involved in the embodiments of the present disclosure.

DETAILED DESCRIPTION

Figure 1:
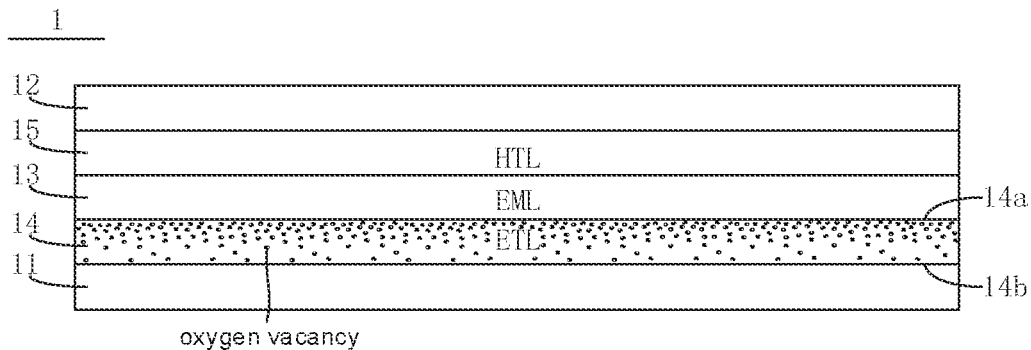
FIG. 1 is a cross-sectional structural diagram of a light-emitting device, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained on the basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meaning, i.e., "including, but not limited to." In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, terms "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, "a plurality of/the plurality of" means two or more unless otherwise specified.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive expression, which does not exclude devices that are applicable to or configured to perform additional tasks or steps.

In addition, the use of the phrase "based on" means openness and inclusiveness, since processes, steps, calculations or other actions "based on" one or more of the stated conditions or values may, in practice, be based on additional conditions or values other than those stated.

As used herein, terms such as "about" or "approximately" is inclusive of a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to cross-sectional diagrams and/or plan diagrams as idealized exemplary drawings. In the accompanying drawings, thickness of layers and sizes of regions are enlarged for clarity. Variations in shape with respect to the drawings due to, for example, manufacturing technologies and/or tolerances may be envisaged. Therefore, the exemplary embodiments should not be construed as being limited to the shapes of the regions shown herein, but include shape deviations due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a light-emitting apparatus. The light-emitting apparatus includes light-emitting devices or a light-emitting substrate, and may, of course, also include other components, for example, a circuit for supplying electrical signals to the light-emitting devices or the light-emitting substrate to drive the light-emitting devices or the light-emitting substrate to emit light. The circuit may be referred to as a control circuit. For example, the circuit is a circuit for driving the light-emitting substrate to emit light, and the circuit may include a circuit board and/or integrated circuit(s) (ICs) electrically connected to the light-emitting substrate.

In some embodiments, the light-emitting apparatus may be a lighting apparatus. In this case, the light-emitting apparatus is used as a light source to realize a lighting function. For example, the light-emitting apparatus may be a backlight module in a liquid crystal display apparatus, a lamp for internal or external lighting, or various signal lamps.

In some other embodiments, the light-emitting apparatus may be a display apparatus for displaying images (i.e., pictures). In this case, the light-emitting apparatus may include a display or a product including a display. The display may be a flat panel display (FPD), a micro display, etc. If divided according to whether a user can see a back of the display, the display can be a transparent display or an opaque display. If divided according to whether the display can be bent or rolled, the display can be a flexible display or an ordinary display (which may be referred to as a rigid display). For example, the product including a display may be: a computer display, a television, a billboard, a laser printer with display capability, a telephone, a mobile phone, a personal digital assistant (PDA), a laptop computer, a digital camera, a camcorder, a viewfinder, a vehicle, a large-area wall, a theater screen or a stadium sign, etc.

Some embodiments of the present disclosure provide a light-emitting device. As shown in FIG. 1, the light-emitting device 1 includes a first electrode 11 and a second electrode 12 that are superposed, a light-emitting layer (EML) 13 located between the first electrode 11 and the second electrode 12, an electron transport layer (ETL) 14 located between the first electrode (i.e., a cathode) 11 and the EML 13, and a hole transport layer (HTL) 15 located between the second electrode (i.e., an anode) 12 and the EML 13.

Figure 2:
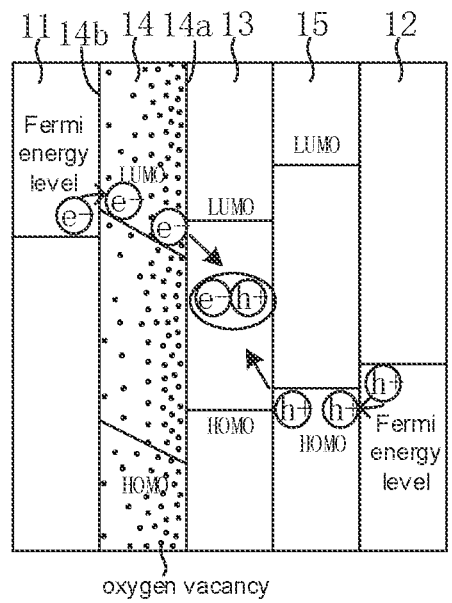
FIG. 2 is an energy level diagram of a light-emitting device, in accordance with some embodiments.

As shown in FIGS. 1 and 2, the ETL 14 includes a first surface 14a proximate to the EML 13 and a second surface 14b proximate to the first electrode 11. Oxygen vacancies are formed in the ETL 14, and a concentration of oxygen vacancies in the ETL 14 gradually increases from the second surface 14b to the first surface 14a.

Here, a material of the ETL 14 may include a metal oxide.

Oxygen vacancies are vacancies formed in a metal oxide or other oxygen-containing compound in which oxygen atoms (oxygen ions) in a lattice detach, resulting in loss of oxygen atoms.

In the above embodiments, by measuring lowest unoccupied molecular orbital (LUMO) energy levels of the first surface 14a and the second surface 14b of the ETL 14 formed with the oxygen vacancies, it may be found that as the concentration of the oxygen vacancies in the ETL 14 gradually increases from the second surface 14b to the first surface 14a, the LUMO energy level of the first surface 14a of the ETL 14 is lower than the LUMO energy level of the second surface 14b of the ETL 14. In a case where a material of the ETL 14 has a certain lattice structure, the number of lattice sites of oxygen atoms (sites occupied by all oxygen atoms in the lattice structure) is related to the lattice structure. The concentration of the oxygen vacancies in the ETL 14 gradually increases, which means that the number of lost oxygen atoms gradually increases. That is, a concentration of lost oxygen atoms gradually increases, and a concentration of remaining oxygen atoms gradually decreases. As the concentration of the oxygen vacancies gradually increases, a LUMO energy level of the ETL 14 may be changed, and the greater the concentration of the oxygen vacancies in the ETL 14, the lower (i.e., the deeper) the LUMO level of the ETL 14.

Here, for example, the material of the ETL 14 is zinc oxide, and a lattice structure of the ETL 14 is a hexagonal wurtzite structure. In the hexagonal wurtzite structure, each zinc atom forms a zinc-centered regular tetrahedral structure with adjacent atoms, or each oxygen atom forms an oxygen-centered regular tetrahedral structure with adjacent atoms. In this case, the lattice structure is known, and the number of lattice sites of oxygen atoms is also known. If oxygen vacancies are formed, the number of oxygen vacancies may be obtained by measuring the number of oxygen atoms, thereby obtaining a percentage of the oxygen vacancies in the number of the lattice sites of the oxygen atoms.

Based on this, in the light-emitting devices provided by the embodiments of the present disclosure, as for the light-emitting devices using different luminescent materials (luminescent materials used in the EML 13), for example, a plurality of light-emitting devices with different emission colors, such as light-emitting devices that emit red light, green light and blue light, if element compositions of ETLs 14 in the light-emitting devices 1 are the same, concentrations of oxygen vacancies in the ETLs 14 in the light-emitting devices 1 may be made different. LUMO energy levels of first surfaces 14a of ETLs 14 in different light-emitting devices 1 are made different, and/or LUMO energy levels of second surfaces 14b of ETLs 14 in different light-emitting devices 1 are made different, so that the LUMO energy levels of the first surfaces 14a of the ETLs 14 in different light-emitting devices 1 are matched with LUMO energy levels of corresponding EMLs. In a light-emitting device, the LUMO energy level of the ETL 14 is lower than the LUMO energy level of the EML 13.

In addition, if a light-emitting device normally emits light, the LUMO energy level of the ETL 14 included in the light-emitting device 1 generally needs to be matched with the LUMO energy level of the EML 13 included in the light-emitting device 1, and thus a constraint of the LUMO level of the ETL 14 of the light-emitting device 1 needs to be taken into account when a material of the EML 13 in the light-emitting device is selected. In a case where the element compositions of the ETLs 14 in different light-emitting devices 1 are the same, a luminescent material whose LUMO energy level is matched with the LUMO energy level of the ETL 14 needs to be selected, which causes that the selection of the luminescent material is limited. In comparison, in a solution provided by the embodiments of the present disclosure, the LUMO energy level of the ETL 14 may be adjusted in the case where the element compositions of the ETLs 14 in different light-emitting devices 1 are the same, for example, the LUMO energy level of the first surface 14a of the ETL 14 is lowered, so that a selection range of the luminescent material may be expanded. Moreover, in a case where the luminescent material is determined, the LUMO energy level of the first surface 14a of the ETL 14 is adjusted according to the LUMO energy level of the luminescent material, so that the finally obtained LUMO energy level of the ETL 14 is better matched with the LUMO energy level of the selected luminescent material, which may increase flexibility of material selection and energy level matching. As a result, flexibility of experiments and research is enhanced, and it is convenient to optimize and improve device performance.

In some embodiments, the material of the ETL 14 includes magnesium-doped zinc oxide, and a doping amount of magnesium in zinc oxide is in a range of 5% to 40%. The doping amount of magnesium in zinc oxide represents a mass percentage of magnesium in the magnesium-doped zinc oxide.

In the embodiments, a depth of the LUMO energy level of the ETL 14 may be adjusted according to the doping amount of magnesium in zinc oxide. As the doping amount of magnesium in zinc oxide increases, the LUMO energy level of the ETL 14 is shallower (i.e., higher). Therefore, as for different light-emitting devices, the doping amount of magnesium in the ETL 14 may be different.

In some embodiments, the LUMO energy level of the first surface 14a of the ETL 14 is lower than the LUMO energy level of the second surface 14b of the ETL 14, and an energy level difference between the LUMO energy level of the EML 13 and the LUMO energy level of the first surface 14a of the ETL 14 is greater than 0 and less than or equal to 0.25 eV. An energy level difference between the LUMO energy level of the second surface 14b of the ETL 14 and a Fermi energy level of the first electrode 11 is greater than 0 and less than or equal to 0.25 eV.

Magnesium may be uniformly doped in zinc oxide in the ETL 14. That is, contents of magnesium at positions with different thicknesses of the ETL 14 are the same before the oxygen vacancies are formed, and thus the LUMO energy level of the first surface 14a is the same as the LUMO energy level of the second surface 14b. After the oxygen vacancies are formed, as the concentration of the oxygen vacancies gradually increases from the second surface 14b to the first surface 14a, the LUMO energy level of the first surface 14a of the ETL 14 is lower than the LUMO energy level of the second surface 14b of the ETL 14.

In this case, the energy level difference between the LUMO energy level of the EML 13 and the LUMO energy level of the first surface 14a of the ETL 14 and the energy level difference between the LUMO energy level of the second surface 14b of the ETL 14 and the Fermi energy level of the first electrode 11 are limited within the above range, electron transport between an interface between the ETL 14 and the first electrode 11 and an interface between the ETL 14 and the EML 13 is facilitated, and electron injection efficiency is improved.

Moreover, since the LUMO energy level of the first surface 14a of the ETL 14 is lower than the LUMO energy level of the second surface 14b of the ETL 14, the Fermi energy level of the first electrode 11 is matched with the LUMO energy level of the second surface 14b, and the LUMO energy level of the first surface 14a is matched with the LUMO energy level of the EML 13, the Fermi energy level of the first electrode 11 may be approximately the same as the LUMO energy level of the EML 13, or even higher than the LUMO energy level of the EML 13. Of course, the LUMO energy level of the EML 13 may also be higher than the Fermi energy level of the first electrode 11. Compared to the related art in which the LUMO energy level of the EML 13 is higher than the Fermi energy level of the first electrode 11, and a luminescent material needs to be selected from materials having a LUMO energy level higher than the Fermi energy level of the first electrode 11, in the embodiments of the present disclosure, an energy level that is more conducive to selection of the material of the EML 13 may also be selected, for example, a luminescent material with better light-emitting performance but a lower LUMO energy level than the Fermi energy level of the first electrode 11 may be selected.

In some embodiments, the Fermi energy level of the first electrode 11 is in a range of −3.8 eV to −4.7 eV. The LUMO energy level of the EML 13 is in a range of −3.5 eV to −4.3 eV.

In some embodiments, the LUMO energy level of the EML 13 may be higher than the Fermi energy level of the first electrode 11 (e.g., in a case where the Fermi energy level of the first electrode 11 is −3.8 eV, the LUMO energy level of the EML 13 may be −3.5 eV, −3.6 eV or −3.7 eV), the LUMO energy level of the EML 13 may also be lower than the Fermi energy level of the first electrode 11 (e.g., in a case where the Fermi energy level of the first electrode 11 is −4.0 eV, the LUMO energy level of the EML 13 may be −4.1 eV, −4.2 eV or −4.3 eV), or the LUMO energy level of the EML 13 may be equal to the Fermi energy level of the first electrode 11 (e.g., the Fermi energy level of the first electrode 11 and the LUMO energy level of the EML 13 may both be −3.8 eV, −3.9 eV, −4.0 eV, −4.1 eV, −4.2 eV or −4.3 eV).

In some embodiments, the light-emitting device 1 may be a quantum dot light-emitting diode (QLED) device. In this case, the EML 13 is made of a quantum dot luminescent material.

The quantum dot luminescent material is mainly composed of IIB-VIA, IIIA-VA or IVA-VIA group elements. For example, the quantum dot luminescent material may include one or more of ZnS, ZnSe, ZnTe, CdS, CdSe, CdTe, HgTe, InP, CuInS, CuInSe, CuInSeS and AgInS.

In some embodiments, quantum dots in the quantum dot luminescent material may have a core-shell structure. For example, the quantum dot luminescent material may include CdS/ZnS, CdSe/ZnS, CdSe/ZnSeS, CdSe/CdS, ZnSe/ZnS, InP/ZnS, CuInS/ZnS, AgInS/ZnS, CuInSe/ZnS, CuInSeS/ZnS or PbS/ZnS. The material before "/" is the core, and the material after "/" is the shell.

In some other embodiments, the quantum dot luminescent material may further include ligands, and the ligands are bound to the quantum dots.

It will be noted that emission spectra of quantum dots with different sizes and materials are in different wavelength regions. For example, emission spectra of ZnS quantum dots with different sizes basically cover an ultraviolet region, emission spectra of CdSe quantum dots basically cover a visible region, and emission spectra of PbSe quantum dots basically cover an infrared region. In practical applications, the quantum dot luminescent materials with different sizes and materials may be selected according to different emission colors.

In some embodiments, in the ETL 14, the number of the oxygen vacancies is 5% to 50% of the number of lattice sites of oxygen atoms within a thickness range of 0 nm to 1 nm from the first surface, and the number of the oxygen vacancies is 5% to 20% of the number of the lattice sites of the oxygen atoms within a thickness range of 0 nm to 1 nm from the second surface.

The number of the lattice sites of the oxygen atoms is related to the lattice structure of the material of the ETL 14 before the oxygen vacancies are formed in the ETL 14, which may refer to the above description of the lattice sites of oxygen atoms.

In the embodiments, the concentration of oxygen vacancies at the first surface 14a of the ETL 14 and the concentration of oxygen vacancies at the second surface 14b of the ETL 14 are controlled within the above ranges by forming the oxygen vacancies in the ETL 14, and thus the LUMO energy level of the first surface 14a of the ETL 14 and the LUMO energy level of the second surface 14b of the ETL 14 may be adjusted. As a result, the LUMO energy level of the first surface 14a of the ETL 14 is matched with the LUMO energy level of the EML, and the LUMO energy level of the second surface 14b of the ETL 14 is matched with the Fermi energy level of the first electrode 11.

In some embodiments, a concentration gradient X of the oxygen vacancies in the ETL 14 is represented by an amount of change in a percentage of the number of oxygen vacancies in the number of lattice sites of oxygen atoms in a thickness of two adjacent 1 nm in the ETL 14. A value range of X satisfies a condition that X is greater than 0 and less than or equal to 25% (0<X≤25%).

The concentration of oxygen vacancies in the ETL 14 gradually decreases from the first surface 14a to the second surface 14b, and it can be known that the concentration of oxygen vacancies at a position proximate to the first surface 14a in the ETL 14 is the maximum, and the concentration of oxygen vacancies at a position proximate to the second surface 14b in the ETL 14 is the minimum. Plasma can be used to bombard the film having electron transport function to form oxygen vacancies in the film having the electron transport function, and it can be known that formation of oxygen vacancies at a position in the ETL 14 is related to a distance between the position and the first surface 14a, and the oxygen atoms in the lattice structure are less likely to be knocked off as the position gets closer to the first electrode 11. Therefore, in a direction of the ETL 14 pointing to first electrode 11, the concentration of oxygen vacancies decreases uniformly or non-uniformly in the ETL 14. Here, the uniform and non-uniform decrease of the concentration difference in space is referred to as the concentration gradient.

For example, a thickness of the ETL 14 is 50 nm, and a change value of the concentration of oxygen vacancies in the thickness of any two adjacent 1 nm may be the same or different. In some embodiments, the change value of the concentration of oxygen vacancies in the thickness of two adjacent 1 nm is greater than 0 and less than 25%.

Here, a calculation process of the change value X of the concentration of oxygen vacancies in the thickness of any two adjacent 1 nm is described. After the bombardment is completed, the ETL 14 is placed in an atmosphere of carbon dioxide, and the oxygen atoms in the ETL 14 bind to the carbon dioxide to form carbonates. Element information in a thickness of 1 nm is collected through X-ray photoelectron spectroscopy (XPS) layer-by-layer bombardment, and thus the number of oxygen atoms in the thickness of 1 nm is determined according to the number of the carbon atoms in the thickness of 1 nm. The number of oxygen atoms before bombardment in the thickness of 1 nm may be determined according to the lattice structure of the metal oxide in the ETL 14, and then the concentration of oxygen vacancies in the thickness of 1 nm is determined as a difference value between the number of oxygen atoms before bombardment and the number of oxygen atoms after bombardment divided by the number of oxygen atoms before bombardment (i.e., the number of lattice sites of oxygen atoms in the lattice structure). Then, the bombardment of the ETL 14 is continued, and the concentration of oxygen vacancies in a thickness of a next 1 nm is calculated according to the above process. A difference between the concentration of oxygen vacancies in the thickness of a certain 1 nm and the concentration of oxygen vacancies in the thickness of a next 1 nm is obtained, and a change amount of the concentration of oxygen vacancies in the thickness of two adjacent 1 nm may be obtained, i.e., the value of X.

Figure 3:
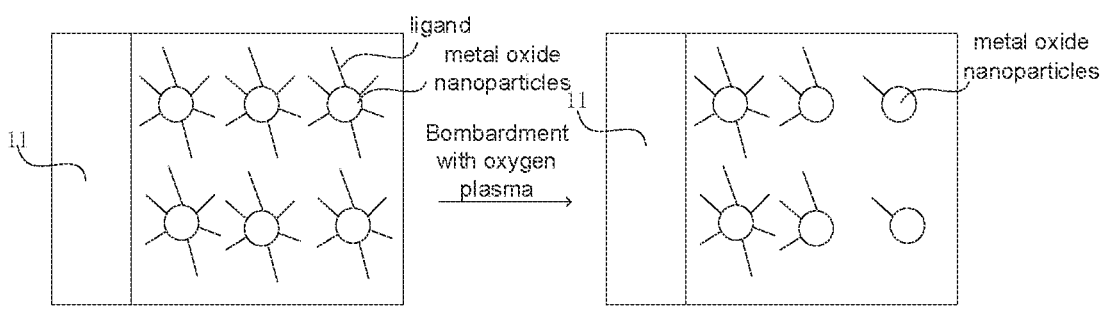
FIG. 3 is a diagram illustrating a change in concentration of ligands in an electron transport layer before and after bombardment with plasma, in accordance with some embodiments.

In some embodiments, as shown in FIG. 3, the ETL 14 includes a metal oxide nanomaterial and at least one ligand bound to a metal atom (i.e., a metal oxide nanoparticle) in the metal oxide nanomaterial, and each ligand is coordinated to the metal atom through at least one coordination group. A concentration of coordination groups in the ETL 14 gradually decreases from the second surface 14b to the first surface 14a.

In some embodiments, the metal oxide nanomaterial may be zinc oxide or magnesium-doped zinc oxide. In this case, the ligand may be ethanolamine, isopropanolamine, propylamine, n-butylamine, isobutylamine, n-pentylamine, etc., or may be a ligand with a plurality of coordination atoms.

In a case where the ligand is the ligand with the plurality of coordination atoms, one ligand may be coordinated to a zinc atom through one coordination atom. In this case, the coordination group may be a molecular fragment with a fixed structure containing the coordination atom. In a case where the ligand is ethanolamine, ethanolamine may be coordinated to a zinc atom through an N atom. In this case, the coordination group may be an entire ligand (i.e., ethanolamine).

Since the ligand is an organic material composed of C, H, O, N and other elements, when plasma is used to bombard the film having the electron transport function, the plasma and elements in the ligand such as C, H, O, and N generate gaseous volatile substances to be discharged, so that the concentration of coordination groups decreases uniformly as a portion of the ETL gets closer to the EML 13. In a case where the ligand is ethanolamine, and ethanolamine is coordinated to the zinc atom through the N atom, element information of each layer thickness is collected through the XPS layer-by-layer bombardment during measurement, and a concentration of coordination atoms may be determined according to a content of nitrogen. Therefore, the concentration of coordination groups may be determined.

It will be noted that in the above embodiments, the ETL 14 may include a material having the electron transport function, or a material having electron injection function. The HTL 15 may include a material having hole transport function, or a material having hole injection function.

Figure 4:
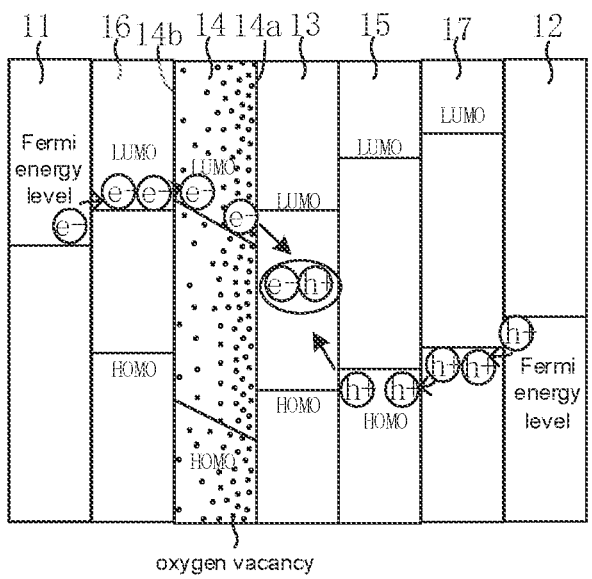
FIG. 4 is a cross-sectional structural diagram of a light-emitting device, in accordance with some other embodiments.

In some other embodiments, as shown in FIG. 4, the light-emitting device 1 further includes an electron injection layer 16 between the first electrode 11 and the ETL 14, and a hole injection layer 17 between the second electrode 12 and the HTL 15, so as to improve injection performance and transport performance of electrons and holes.

Figure 5:
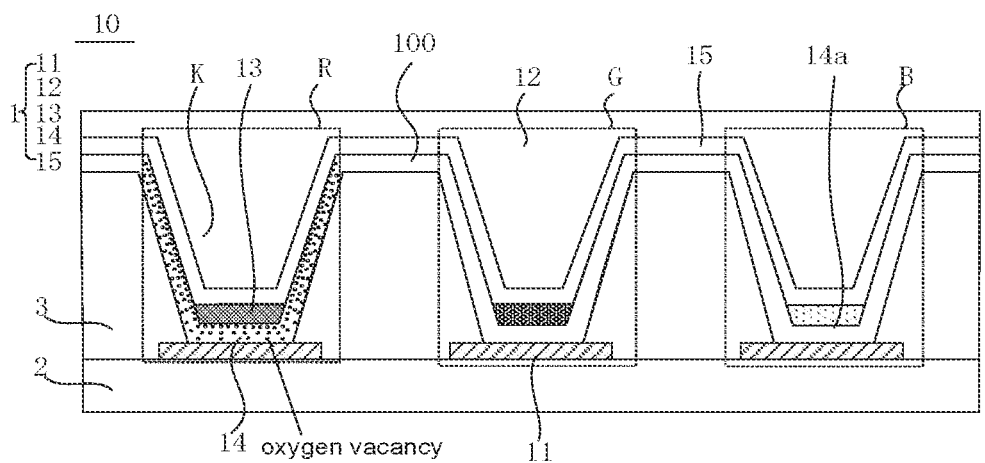
FIG. 5 is a cross-sectional structural diagram of a light-emitting substrate, in accordance with some embodiments.
Figure 6:
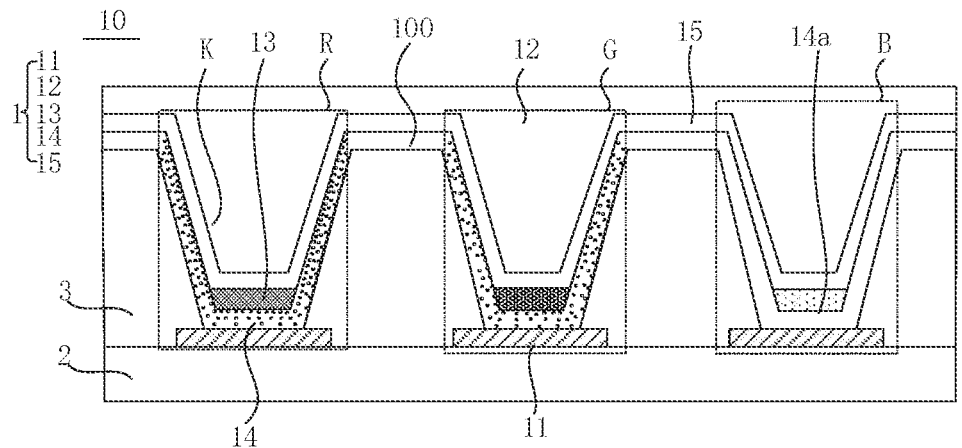
FIG. 6 is a cross-sectional structural diagram of a light-emitting substrate, in accordance with yet some other embodiments.
Figure 7:
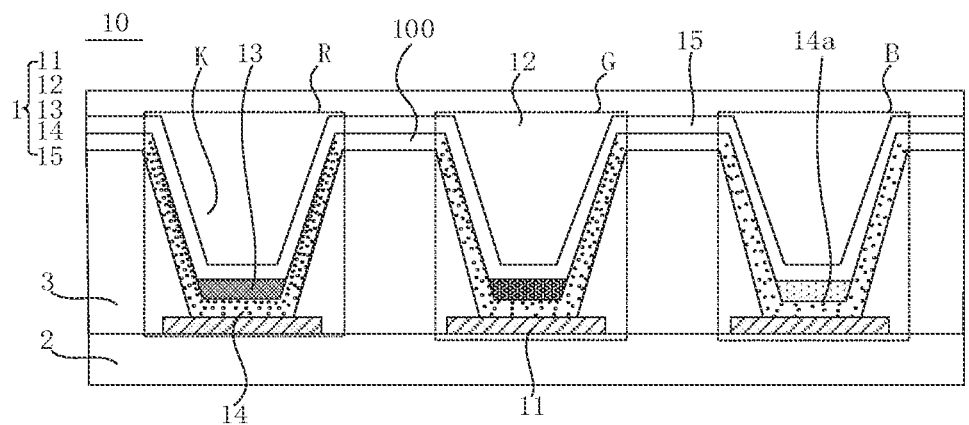
FIG. 7 is a cross-sectional structural diagram of a light-emitting substrate, in accordance with yet some other embodiments.

Some embodiments of the present disclosure provide a light-emitting substrate. As shown in FIGS. 5, 6 and 7, the light-emitting substrate 10 includes a base 2 and a plurality of light-emitting devices 1 disposed on the base 2. The plurality of light-emitting devices 1 may be all the light-emitting devices included in the light-emitting substrate 10, or may be a part of the light-emitting devices included in the light-emitting substrate 10. At least one light-emitting device 1 is the light-emitting device as described in the above embodiments (i.e., the light-emitting device shown in FIG. 1, the electron transport layer of which includes the two surfaces with different LUMO energy levels), and the first electrode 11 of each light-emitting device 1 as described in the above embodiments is closer to the base 2 than the second electrode 12 thereof. In this case, the light-emitting substrate 10 is an "upside-down" light-emitting substrate. Alternatively, the second electrode 12 of the light-emitting device 1 in the above-described light-emitting substrate is closer to the base 2 than the first electrode 11. That is, the light-emitting substrate in this case is an "upright" light-emitting substrate. In some examples, the electron transport layer of each of the plurality of light-emitting devices 1 includes the two surfaces with different LUMO energy levels. In some examples, electron transport layers of a part of the plurality of light-emitting devices 1 include the two surfaces with different LUMO energy levels, and electron transport layers of remaining light-emitting devices include two surfaces with the same LUMO energy level.

The light-emitting substrate provided by the embodiments of the present disclosure has the same technical effects as the light-emitting device described above, and reference may be made to the above description of the light-emitting device, which is not repeated here.

According to whether the emission colors of the plurality of light-emitting devices 1 are the same, the light-emitting substrate 10 may emit monochromatic light or colored light.

In a case where the light-emitting substrate 10 emits monochromatic light, the plurality of light-emitting devices (e.g., all the light-emitting devices 1) included in the light-emitting substrate 10 emit light of the same color (such as red light or white light). For example, the EML 13 is made of a quantum dot light-emitting material, in a case where the plurality of light-emitting devices 1 included in the light-emitting substrate 10 all emit red light, the EML 13 of each light-emitting device 1 is made of a red quantum dot light-emitting material. In a case where the plurality of light-emitting devices 1 included in the light-emitting substrate 10 all emit white light, the EML 13 of each light-emitting device 1 may be made of a mixed material of a red quantum dot light-emitting material, a green quantum dot light-emitting material and a blue quantum dot light-emitting material. In either case, according to a LUMO energy level of the selected material of the EML 13, oxygen vacancies may be formed in the film having the electron transport function in regions where all the light-emitting devices 1 are located, so as to obtain the ETLs 14 having LUMO energy levels matched with the LUMO energy levels of the EMLs 13. In this case, element compositions of different ETLs 14 are the same (e.g., they are all magnesium-doped oxides, and doping amount of magnesium are the same), and concentrations of oxygen vacancies are also the same (in this case, LUMO energy levels of first surfaces of different ETLs 14 are approximately the same, and LUMO energy levels of second surfaces thereof are approximately the same). Or element compositions of different ETLs 14 may be different (e.g., they are all magnesium-doped oxides, but doping amounts of magnesium are different), and concentrations of oxygen vacancies are also different (in this case, LUMO energy levels are adjusted by adjusting the doping amount of magnesium and the concentration of oxygen vacancies together, LUMO energy levels of first surfaces of different ETLs 14 are approximately the same, and LUMO energy levels of second surfaces thereof are approximately the same).

In a case where the light-emitting substrate 10 emits colored light, in some embodiments, as shown in FIGS. 5, 6 and 7, the plurality of light-emitting devices 1 include multiple types of light-emitting devices 1 with different emission colors, and at least one light-emitting device 1 is the light-emitting device(s) shown in FIG. 1. The at least one light-emitting device 1 may include at least one type of light-emitting devices 1 with at least one emission color. That is, among multiple types of light-emitting devices 1, each of the at least one type of light-emitting devices 1 is the light-emitting device 1 shown in FIG. 1.

In some embodiments, in a case where the at least one light-emitting device includes at least two types of light-emitting devices with at least two emission colors, the material of the ETL includes magnesium-doped zinc oxide. As for light-emitting devices with different emission colors, doping amounts of magnesium in zinc oxide in the ETLs are the same or different. In a case where the doping amounts of magnesium in zinc oxide in the ETLs are the same, the LUMO energy levels of the ETLs 14 are the same.

In some other embodiments, in a case where the doping amounts of magnesium in zinc oxide in the ETLs of light-emitting devices with different emission colors are the same, the concentrations of oxygen vacancies at least at the first surfaces of the ETLs are different. That is, before the oxygen vacancies are formed, the LUMO energy levels of the ETLs 14 of the light-emitting devices with the different emission colors are the same, and after the oxygen vacancies are formed, the LUMO energy levels of the first surfaces 14a of the ETLs 14 of the light-emitting devices with the different emission colors are made to be matched with the LUMO energy levels of respective EMLs 13.

For example, the plurality of light-emitting devices 1 include first light-emitting devices R emitting red light, second light-emitting devices G emitting green light, and third light-emitting devices B emitting blue light. In a first case, as shown in FIG. 5, light-emitting devices of one emission color are the light-emitting devices shown in FIG. 1. When the light-emitting substrate 10 is manufactured, oxygen vacancies may be formed only in the ETL 14 of the first light-emitting device R, so as to obtain the ETL 14 having the LUMO energy level matched with the LUMO energy level of the EML 13 of the first light-emitting device R. In a second case, as shown in FIG. 6, light-emitting devices of two emission colors are the light-emitting devices shown in FIG. 1. When the light-emitting substrate 10 is manufactured, oxygen vacancies may be formed only in the ETL 14 of the second light-emitting device G and the ETL of the first light-emitting device R, so as to obtain the ETL 14 having the LUMO energy level matched with the LUMO energy level of the EML 13 of the second light-emitting device G and the ETL 14 having the LUMO energy level matched with the LUMO energy level of the EML 13 of the first light-emitting device R. In a case where the element compositions of the ETLs 14 of the light-emitting devices with the different emission colors are the same (e.g., they are all magnesium-doped zinc oxide, and the doping amounts of magnesium are the same), the concentrations of oxygen vacancies at least at the first surfaces 14a of the ETLs 14 are different. In this case, the concentrations of oxygen vacancies at the first surfaces 14a of the ETLs 14 are different, and the concentrations of oxygen vacancies at the second surfaces 14b of the ETLs 14 may be the same or different. In a third case, as shown in FIG. 7, the at least one light-emitting device 1 includes three types of light-emitting devices. That is, oxygen vacancies are formed in the ETLs 14 of the first light-emitting device R, the second light-emitting device G and the third light-emitting device B, so that the LUMO energy level of the ETL 14 included in each light-emitting device 1 is matched with the LUMO energy level of the EML 13 included in corresponding light-emitting device 1. In a case where the element compositions of the ETLs 14 of the light-emitting devices with the different emission colors are the same (i.e., they are all magnesium-doped zinc oxide, and the doping amounts of magnesium are the same), similarly to the second case, the concentrations of oxygen vacancies at least at the first surfaces 14a of the ETLs 14 are different.

Here, the above third case is still taken as an example, assuming that the LUMO energy level of the EML 13 of the first light-emitting device R is lower than the LUMO energy level of the EML 13 of the second light-emitting device G, and the LUMO energy level of the EML 13 of the second light-emitting device G is lower than the LUMO energy level of the EML 13 of the third light-emitting device B, as shown in FIG. 7, the concentration of oxygen vacancies in the ETL 14 of the first light-emitting device R is greater than the concentration of oxygen vacancies in the ETL 14 of the second light-emitting device G, and the concentration of oxygen vacancies in the ETL 14 of the second light-emitting device G is greater than the concentration of oxygen vacancies in the ETL 14 of the third light-emitting device B.

In some embodiments, as shown in FIGS. 5, 6 and 7, the light-emitting substrate 10 further includes a pixel defining layer 3, and a film 100 having electron transport function located on a side of the pixel defining layer 3 away from the base 2. The pixel defining layer 3 has a plurality of openings K. The film 100 having the electron transport function includes a portion located in each opening K and a portion covering the pixel defining layer 3 except for the openings K. The portion of the film 100 having the electron transport function located in each opening K serves as the ETL 14 of each light-emitting device 1. A LUMO energy level of the portion of the film 100 having the electron transport function covering the pixel defining layer 3 except for the openings K is higher than a LUMO energy level of a surface of the ETL 14 away from the base 2 (i.e., the first surface 14a).

In the embodiments, the element compositions of portions of the film 100 having the electron transport function may be the same or different. In a case where the element compositions of portions of the film 100 having the electron transport function are the same, taking a material of the film 100 having the electron transport function including magnesium-doped zinc oxide as an example, the doping amounts of magnesium in zinc oxide are the same in the portion of the film 100 having the electron transport function covering the pixel defining layer 3 except for the openings K and each ETL 14. In this case, oxygen vacancies may be formed in each ETL 14, so that the LUMO energy level of the portion of the film 100 having the electron transport function covering the pixel defining layer 3 except for the openings K is higher than the LUMO energy level of the surface of the ETL 14 away from the base 2 (i.e., the first surface 14a). In a case where the element compositions of the portions of the film 100 having the electron transport function are different, by adjusting the doping amounts of magnesium in zinc oxide in the portion of the film 100 having the electron transport function covering the pixel defining layer 3 except for the opening K and each ETL 14, and forming oxygen vacancies in each ETL 14, the LUMO energy level of the portion of the film 100 having the electron transport function covering the pixel defining layer 3 except for the openings K is higher than the LUMO energy level of the surface of the ETL 14 away from the base 2 (i.e., the first surface 14a).

Figure 8:
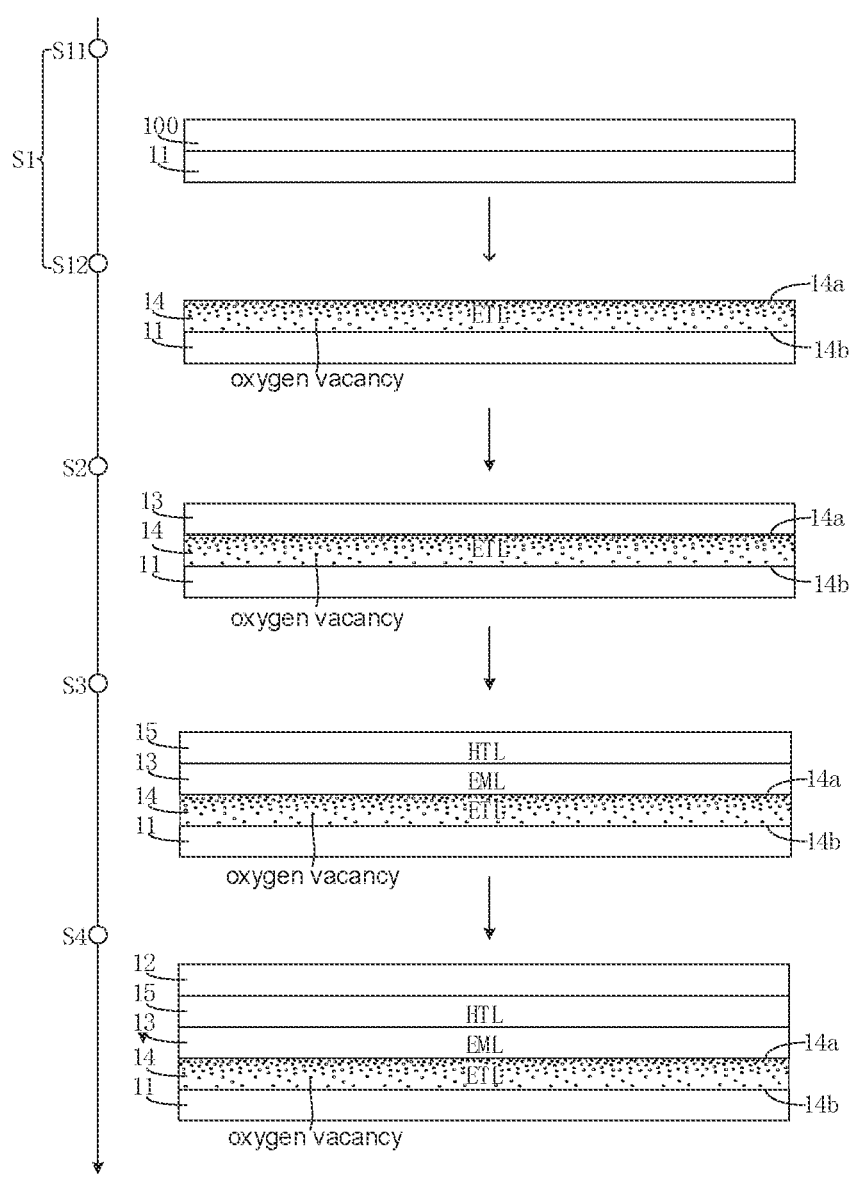
FIG. 8 is a flow diagram of a method of manufacturing a light-emitting device, in accordance with some embodiments.

Some embodiments of the present disclosure provide a method of manufacturing a light-emitting device, and as shown in FIG. 8, the method includes step 1 to step 4 (S1 to S4).

In S1, an electron transport layer (ETL) 14 is formed on a first electrode 11. The ETL 14 includes a first surface 14a away from the first electrode 11 and a second surface 14b proximate to the first electrode 11. Oxygen vacancies are distributed in the ETL 14, and a concentration of oxygen vacancies in the ETL 14 gradually increases from the second surface 14b to the first surface 14a. Forming the ETL 14 on the first electrode 11 may include step 11 and step 12 (S11 to S12).

In S11, a film 100 having electron transport function is formed on the first electrode 11.

The film 100 having the electron transport function may be formed on the first electrode 11 through an inkjet printing, spin coating, deposition or sputtering process.

In a case where the film 100 having the electron transport function includes a metal oxide nanomaterial, the film 100 having the electron transport function may be formed on the first electrode 11 through a sputtering or deposition process.

In a case where the film 100 having the electron transport function further includes ligands bound to the metal oxide nanomaterial, a material having the electron transport function may be dissolved in a solvent, and then the film 100 having the electron transport function may be formed on the first electrode 11 through an inkjet printing or spin-coating process.

In S12, the film 100 having the electron transport function is bombarded by plasma for a first duration from a side of the film 100 having the electron transport function away from the first electrode 11, so as to form oxygen vacancies in the film 100 having the electron transport function to obtain the ETL 14.

Plasma is an ionized gaseous substance composed of positive and negative ions generated after some of atoms or atomic groups deprived of the electrons are ionized, and is an ionized "gas", which exhibits highly excited unstable states, including ions, electrons, atoms and molecules.

Still, for example, the film 100 having the electron transport function includes the metal oxide nanomaterial, when the film 100 having the electron transport function is bombarded by plasma, oxygen atoms (oxygen ions) in a metal oxide lattice detach, resulting in loss of oxygen atoms and formation of oxygen vacancies.

It will be noted that, the film 100 having the electron transport function is bombarded by using plasma for the first duration from the side of the film 100 having the electron transport function away from the first electrode 11, and the concentration of oxygen vacancies varies according to a depth from a certain position in the film 100 having the electron transport function to the EML. The ETL 14 before bombardment and the ETL 14 after bombardment are placed in an atmosphere of carbon dioxide, and oxygen atoms bind to carbon dioxide to form carbonates. The element information of each thickness layer is collected through the XPS layer-by-layer bombardment, and a concentration of oxygen atoms in each thickness layer may be determined according to a carbon content of each layer. By comparison with prior to the formation of oxygen vacancies, it has been found that the concentration of oxygen vacancies gradually decreases as a portion of the ETL gets closer to the first electrode 11. The concentration of oxygen vacancies of a certain position is related to a distance from the certain position in the film to a bombardment side (here, the first surface 14a) when plasma is used for bombardment. Therefore, the farther the distance from the position in the film to the first surface 14a is, the smaller the concentration of oxygen vacancies is.

A working gas used in the plasma bombardment may include at least one of oxygen, argon, fluorine-based gas, nitrogen and carbon dioxide. The fluorine-based gas includes at least one of CF4, SF6, NF3 and C2F8.

In S2, a light-emitting layer (EML) 13 is formed on a side of the ETL 14 away from the first electrode 11.

The EML 13 may be made of a quantum dot light-emitting material. In this case, the EML 13 may be formed on the side of the ETL 14 away from the first electrode 11 through a spin-coating process.

In S3, a hole transport layer (HTL) 15 is formed on a side of the EML 13 away from the ETL 14.

The HTL 15 may be made of a polymer material, and the HTL 15 may be formed on the side of the EML 13 away from the ETL 14 through the spin-coating process.

In S4, a second electrode 12 is formed at a side of the EML 13 away from the ETL 14, so as to obtain the light-emitting device 1.

That is, the second electrode 12 is formed on a side of the HTL 15 away from the EML 13.

The first electrode 11 is a cathode, and the second electrode 12 is an anode. A material of the anode may be selected from aluminum, silver, gold or indium zinc oxide (IZO). The first electrode 11 of aluminum, silver, or gold may be formed by vapor deposition, and the first electrode 11 of IZO may be formed by sputtering.

The method of manufacturing the light-emitting device provided by the embodiments of the present disclosure has the same technical effects as the light-emitting device as described above, and reference may be made to the above description of the light-emitting device, which is not repeated here.

Figure 9:
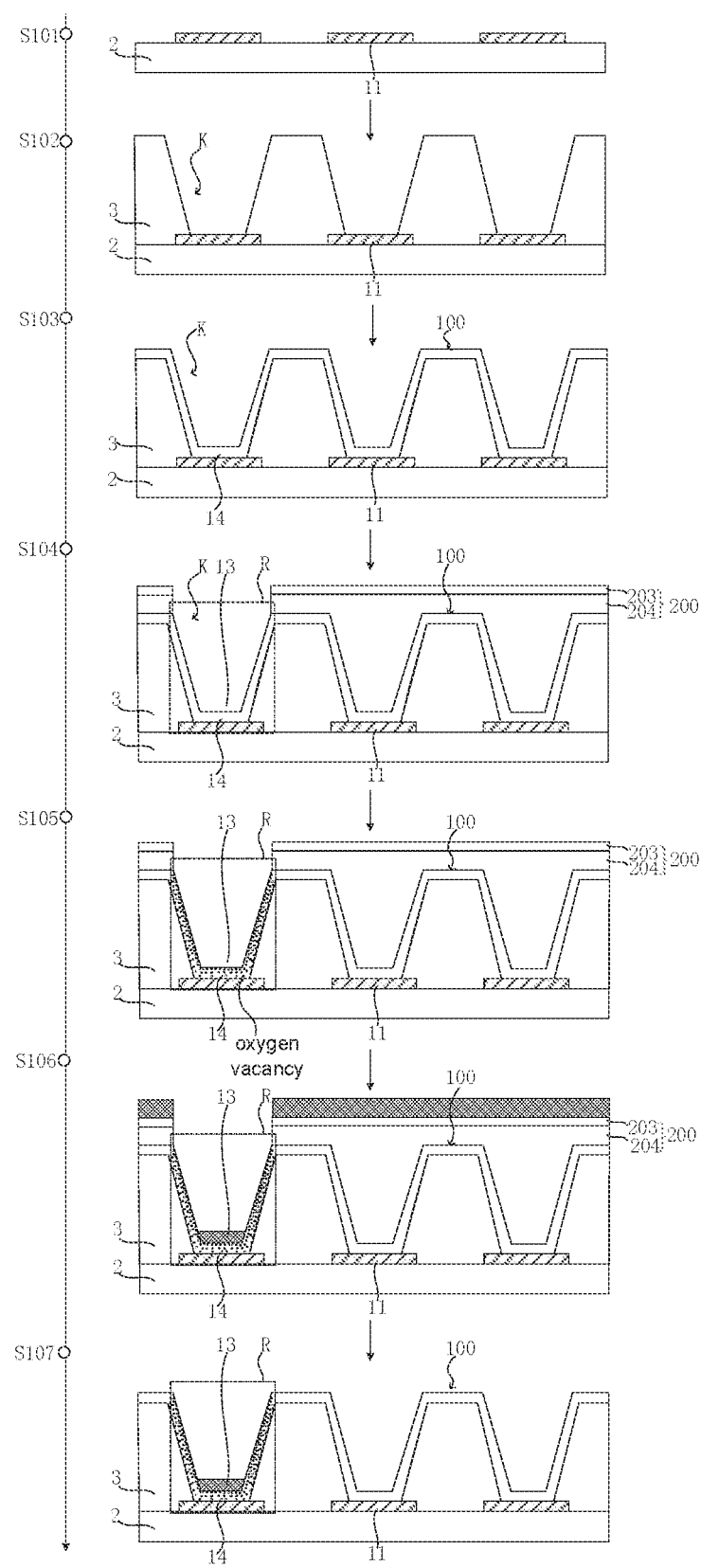
FIG. 9 is a flow diagram of a method of manufacturing a light-emitting substrate, in accordance with some embodiments.

The embodiments of the present disclosure provide a method of manufacturing a light-emitting substrate, and as shown in FIG. 9, the method includes:

forming a plurality of light-emitting devices 1 on a base 2, at least one light-emitting device 1 being the light-emitting device as described above, and a first electrode 11 of each light-emitting device 1 being closer to the base 2 than a second electrode 12 thereof.

In this case, the light-emitting substrate 10 is an "upside-down" light-emitting substrate.

The plurality of light-emitting devices 1 may emit light of the same color or light of different colors. It can be known that the light-emitting substrate 10 may emit monochromatic light or colored light.

In a case where the light-emitting substrate 10 emits monochromatic light, the at least one light-emitting device 1 may include all the light-emitting devices 1.

In a case where the light-emitting substrate 10 emits colored light, the at least one light-emitting device 1 may include light-emitting devices emitting light of the same color or multiple types of light-emitting devices emitting light of different colors.

In some embodiments, the plurality of light-emitting devices 1 includes N types of light-emitting devices with different emission colors, and N is an integer greater than or equal to 2.

As shown in FIG. 9, forming the plurality of light-emitting devices 1 on the base 2 may include step 101 to step 107 (S101 to S107).

In S101, a plurality of first electrodes 11 are formed on the base 2.

The first electrode is the cathode, and the first electrode 11 may be made of Al, Ag, indium tin oxide (ITO) or magnesium aluminum alloy. The plurality of first electrodes 11 may be formed by sputtering, or evaporating a conductive film and then patterning the conductive film.

In S102, a pixel defining layer 3 is formed on the base 2 on which the plurality of first electrodes 11 have been formed. The pixel defining layer 3 has a plurality of openings K, and an opening K exposes one first electrode 11.

The pixel defining layer 3 may be made of an inorganic material or an organic material, which is not specifically limited here.

For example, in a case where the pixel defining layer 3 is made of an inorganic material, the material of the pixel defining layer 3 may include an inorganic oxide material. In a case where the pixel defining layer 3 is made of an organic material, the material of the pixel defining layer 3 may be selected from one or more of polyethylene glycol, polyvinyl acetate, cellulose and chitosan.

In S103, a film 100 having electron transport function is formed on the base 2 on which the plurality of first electrodes 11 have been formed.

That is, a film 100 having the electron transport function is formed on the base 2 on which the pixel defining layer 3 has been formed.

In this case, the film 100 having the electron transport function may be formed on the base 2 on which the pixel defining layer 3 has been formed by an inkjet printing, sputtering, deposition or spin-coating process, so that the film 100 having the electron transport function includes at least portions formed in each opening K.

In some embodiments, the film 100 having the electron transport function is formed on the base 2 on which the plurality of first electrodes 11 have been formed through the inkjet printing or spin-coating process. A material of the film 100 having the electron transport function may include a metal oxide nanomaterial and ligands bound to the metal oxide nanomaterial. In this case, a material having the electron transport function may be dissolved in a solvent to obtain a solution of the material having the electron transport function, and then a solution layer may be formed on the base through the inkjet printing or spin-coating process, and finally the film 100 having the electron transport function may be obtained by annealing.

In S104, an I-th mask 200 is formed on the base 2 on which the film 100 having electron transport function has been formed. The I-th mask 200 exposes portions of the film located in regions where an I-th type of light-emitting devices are located, and covers a portion of the film located in a region except the regions where the I-th type of light-emitting devices are located.

In S105, the portions of the film 100 located in the regions where the I-th type of light-emitting devices are located are bombarded for an I-th duration by using plasma from a side of the film 100 having the electron transport function away from the base 2, so that oxygen vacancies are formed in the portions of the film 100 located in the regions where the I-th type of light-emitting devices are located to obtain I-th ETLs 14. I is greater than or equal to 1, and less than or equal to N.

For example, the plurality of light-emitting devices 1 include three types of light-emitting devices with different emission colors, i.e., first light-emitting devices R emitting red light, second light-emitting devices G emitting green light, and third light-emitting devices G emitting blue light. For example, the I-th light-emitting devices are the first light-emitting devices R, the I-th mask 200 is a mask exposing portions of the film located in regions where the light-emitting devices emitting red light are located and covering a portion of the film located in a region except the regions where the light-emitting devices emitting red light are located.

The I-th mask 200 may be a single-layer mask of photoresist, or a double-layer mask of a sacrificial layer and a photoresist layer.

Figure 10:
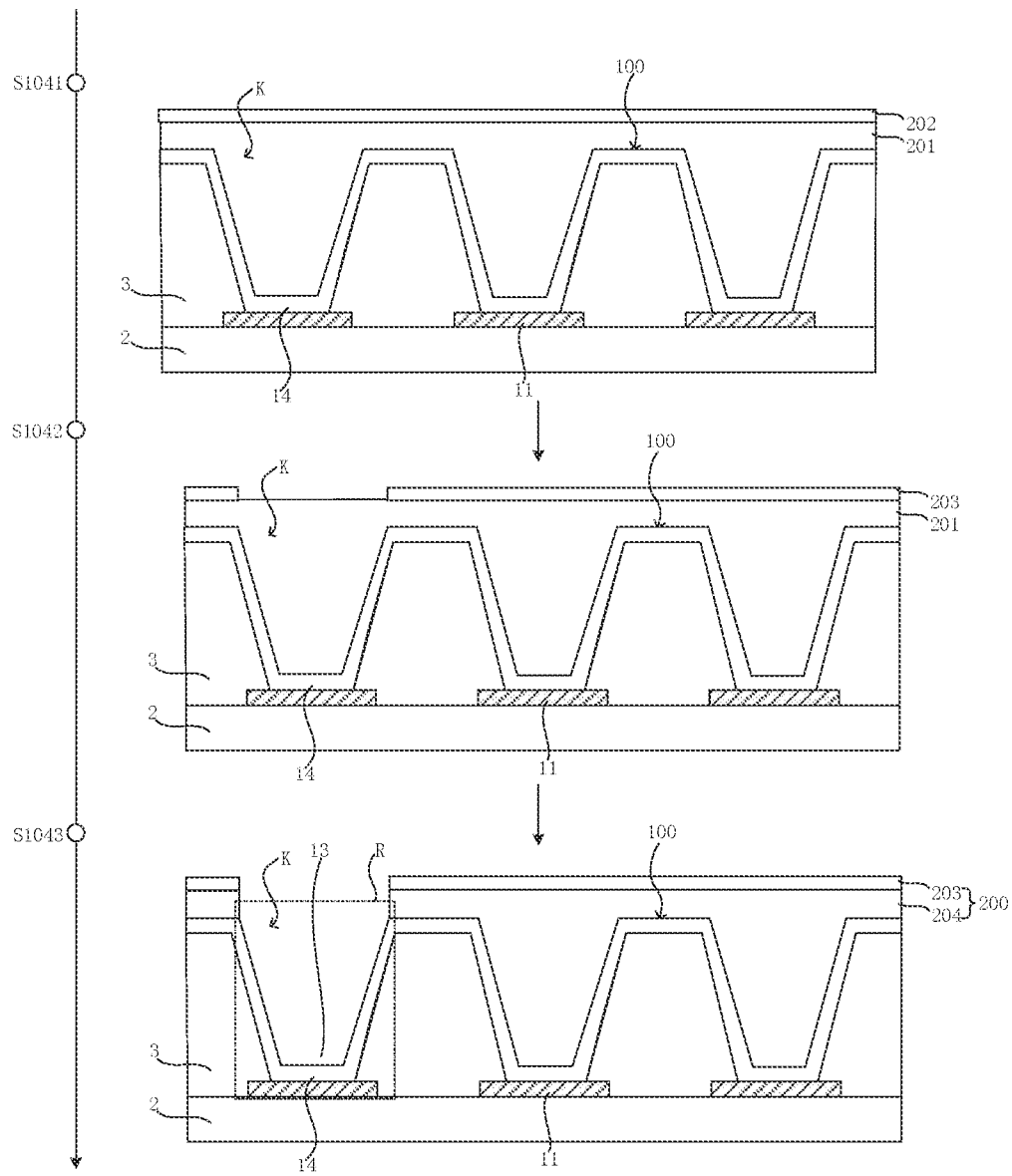
FIG. 10 is a flow diagram of a method of manufacturing an I-th mask, in accordance with some embodiments.

In some embodiments, forming the I-th mask 200 on the base 2 on which the film 100 having the electron transport function has been formed in S104, as shown in FIG. 10, includes:

S1041, forming a sacrificial film 201 and a photoresist film 202 sequentially on the base 2 on which the film 100 having the electron transport function has been formed.

S1042, removing portions of the photoresist film 202 covering the regions where the I-th type of light-emitting devices are located through exposure and development to obtain a photoresist layer 203.

S1043, bombarding the base 2 on which the photoresist layer 203 has been formed by using plasma, so as to remove portions of the sacrificial film 201 covering the regions where the I-th type of light-emitting devices are located to obtain the I-th mask 200 including the photoresist layer 203 and a sacrificial layer 204.

On this basis, bombarding the portions of the film 100 located in the regions where the I-th type of light-emitting devices are located for the I-th duration by using plasma from the side of the film 100 having the electron transport function away from the base 2, includes: continuously bombarding the base 2 for the I-th duration after removing the portions of the sacrificial film 201 covering the regions where the I-th type of light-emitting devices are located, so as to form the I-th ETLs 14 in the regions where the I-th type of light-emitting devices are located.

In the embodiments, by using the double-layer mask of the sacrificial layer 201 and the first photoresist layer 202, oxygen vacancies may be formed in the film 100 having the electron transport function by prolonging bombardment time after the sacrificial film 201 is bombarded to dry-etch the sacrificial film 201. Therefore, it is not necessary to form oxygen vacancies in the film 100 having the electron transport function exclusively by using plasma after removing the portions of the photoresist film 202 covering the regions where the I-th type of light-emitting devices are located, which may simplify process steps.

In some embodiments, a LUMO energy level of the portions of the film 100 having the electron transport function covering the regions where the I-th type of light-emitting devices are located is higher than a LUMO energy level of the I-th EMLs, and a LUMO energy level of surfaces of the I-th ETLs away from the base 2 (i.e., the first surface 14a) is lower than the LUMO energy level of the I-th EMLs.

That is, the LUMO energy level of the surface of the I-th ETL away from the base 2 (i.e., the first surface 14*a*) is lower than a LUMO energy level of the film 100 having the electron transport function.

In a case where the material of the film 100 having the electron transport function includes magnesium-doped zinc oxide, according to different I values and whether the doping amounts of magnesium in the portions of the film 100 having the electron transport function covering the regions where different types of light-emitting devices are located are the same, the LUMO energy levels of the portions of the film 100 having the electron transport function covering the regions where the different types of light-emitting devices are located may be the same or different.

In S106, I-th EMLs 13 are formed on a side of the I-th ETLs 14 away from the base 2.

After the I-th ETL 14 is formed, the I-th EML 13 may be formed on the side of the I-th ETL 14 away from the base under shielding of the I-th mask 200.

In S107, the I-th mask 200 is removed.

The I-th mask is removed after the I-th EML 13 is formed. In this way, the I-th EML 13 may be formed in each opening K where the I-th ETL 14 has been formed, so as to form one light-emitting device 1 in each opening K.

When the I-th mask 200 is removed, the sacrificial layer 204 may be dissolved away by means of organic solvent dissolution, so that the photoresist layer 203 covered on the sacrificial layer 204 is also removed together.

I may be any one of I to N, and the I-th type of light-emitting devices 1 may be any one of N types of light-emitting devices 1 with different emission colors.

Still, for example, the plurality of light-emitting devices 1 include three types of light-emitting devices with different emission colors, i.e., the first light-emitting devices R emitting red light, the second light-emitting devices G emitting green light, and the third light-emitting devices B emitting blue light. I may be any one of I, 2 and 3.

In some embodiments, the I-th duration is different in a case where the value of I is different. That is, in a case where the value of I is 1, 2 and 3, the first light-emitting device 1, the second light-emitting device 1 and the third light-emitting device 1 emit red light, green light, and blue light, respectively. In this case, in a case where the element compositions of the film 100 having the electron transport function are the same and thus LUMO energy levels of different regions of the film 100 having the electron transport function are the same, the ETLs 14 with different LUMO energy levels may be formed by forming oxygen vacancies with different concentrations in different regions of the film 100 having the electron transport function corresponding different types of light-emitting devices, so that the LUMO energy levels of the ETLs 14 (which are different) are matched with the LUMO energy levels of the EMLs 13 in their respective regions.

For example, a LUMO energy level of an EML 13 emitting red light is lower than a LUMO energy level of an EML 13 emitting green light, and the LUMO energy level of the EML 13 emitting green light is lower than a LUMO energy level of an EML 13 emitting blue light. The LUMO energy level of the ETL 14 decreases as the concentration of oxygen vacancies increases. When the value of I is 1, 2 and 3, the concentration of oxygen vacancies in the first ETL 14, the concentration of oxygen vacancies in the second ETL 14 and the concentration of oxygen vacancies in the third ETL 14 gradually decrease. Therefore, in a case where the film 100 having the electron transport function is bombarded by plasma at the same speed, when the value of I is 1, 2 and 3, the first duration, the second duration and the third duration are gradually shortened.

In order to facilitate understanding by those skilled in the art, the embodiments of the present disclosure will be further exemplarily described below through specific experimental examples. The following description will be made by taking an example in which the light-emitting substrate includes light-emitting devices emitting red light, light-emitting devices emitting green light, and light-emitting devices emitting blue light.

Experimental Example 1

Figure 11A:
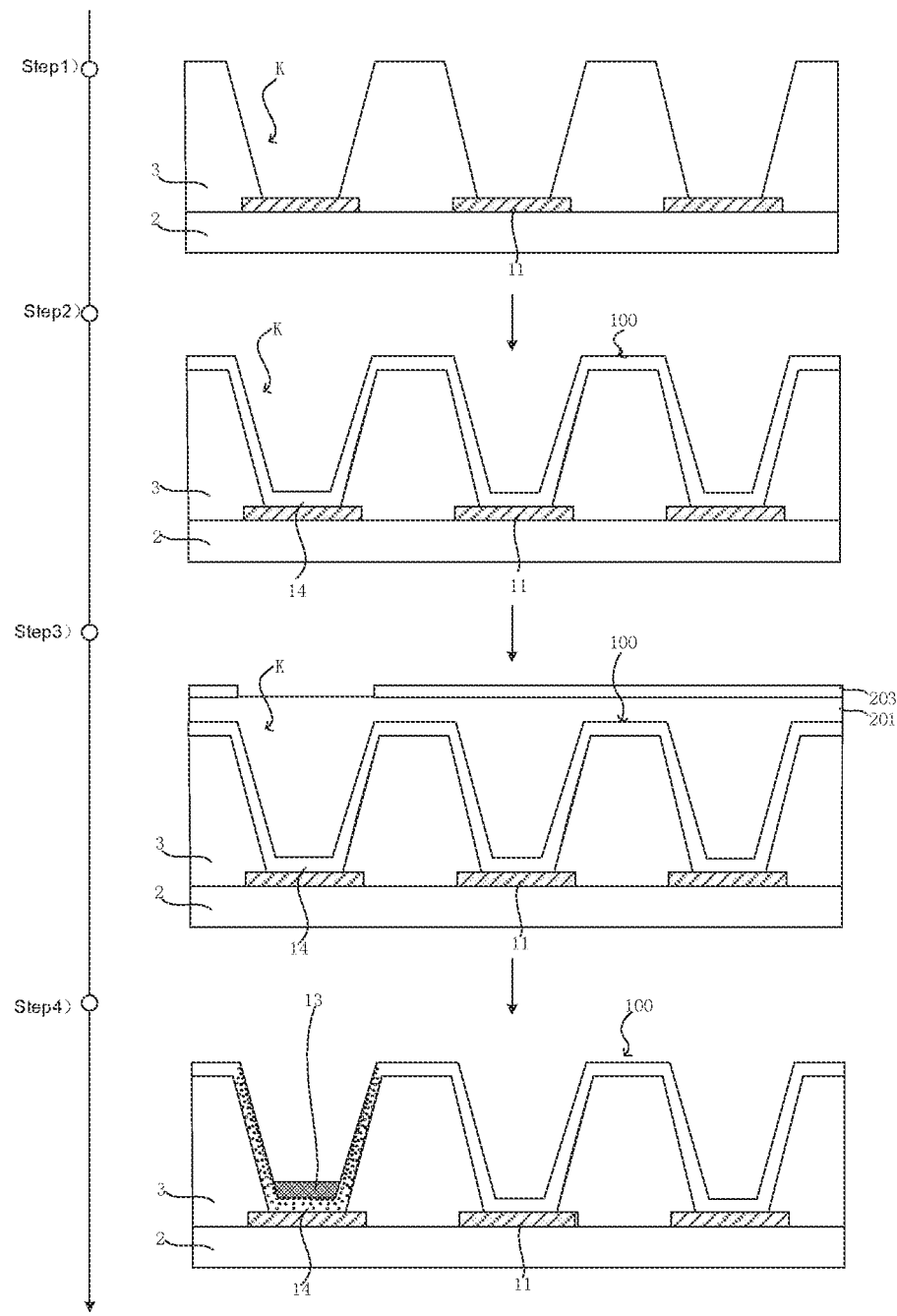
FIGS. 11A and 11B are flow diagrams of a method of manufacturing a light-emitting substrate, in accordance with some other embodiments.
Figure 11B:
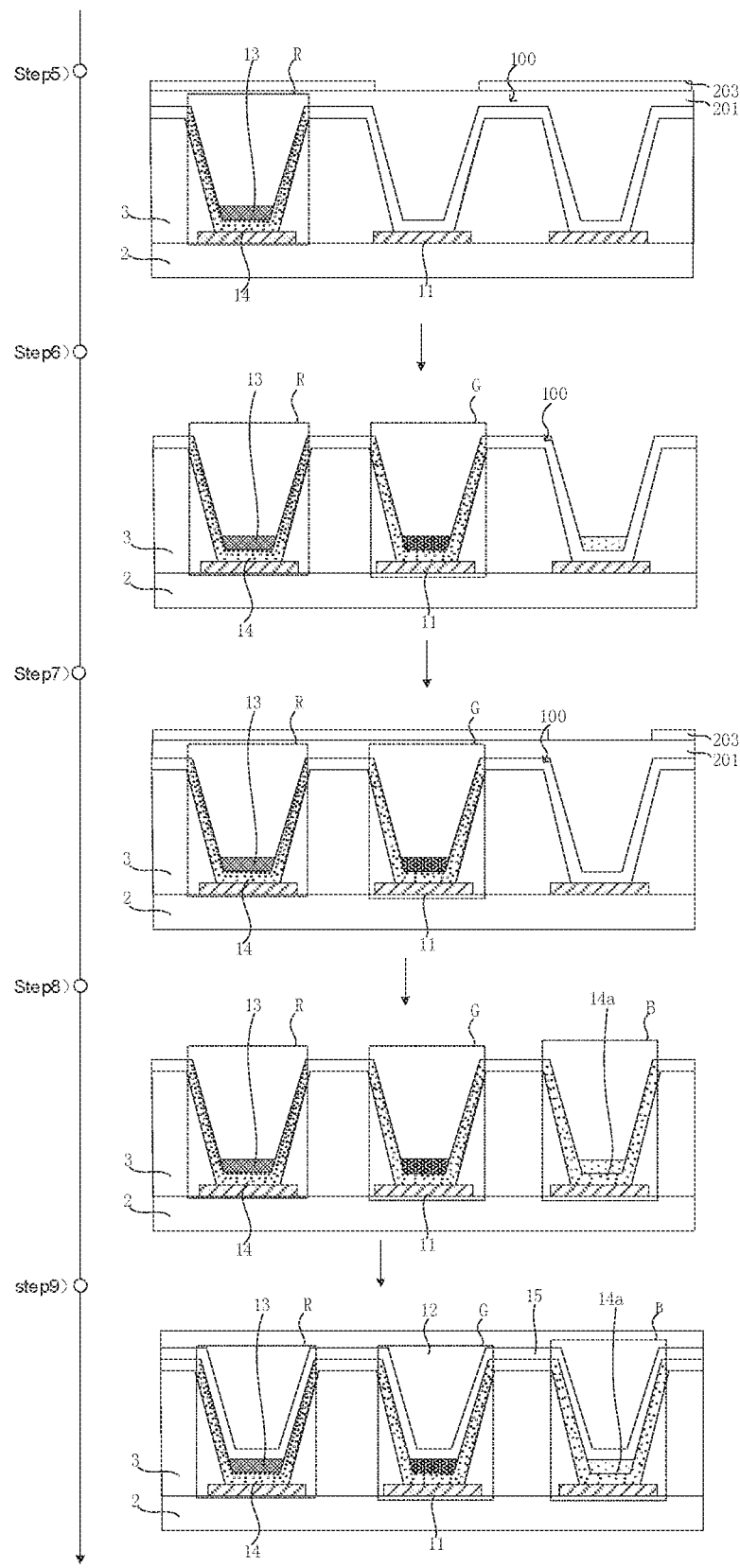

As shown in FIGS. 11A and 11B, in step 1), a plurality of cathodes (i.e., first electrodes 11) and a pixel defining layer 3 are formed on the base 2. The pixel defining layer 3 has a plurality of openings K, and each opening K exposes one cathode.

In step 2), a coordinated material having electron transport function is dissolved in an ethanol solution to obtain a spin-coating liquid, and then the spin-coating liquid is spin-coated on the base 2 on which the plurality of cathodes and the pixel defining layer 3 have been formed by a spin-coating process, so as to obtain the film 100 having electron transport function.

In step 3), a sacrificial film 201 and a negative photoresist film (i.e., a photoresist film 202) are formed on the base 2 on which the film 100 having electron transport function has been formed through spin-coating processes, and then a first patterned negative photoresist layer (i.e., a photoresist layer 203) is obtained through exposure and development. The first patterned negative photoresist layer exposes first portions of the sacrificial film 201, and the first portions of the sacrificial film 201 are portions of the sacrificial film 201 covering regions where the red quantum dot light-emitting devices are located.

Figure 12:
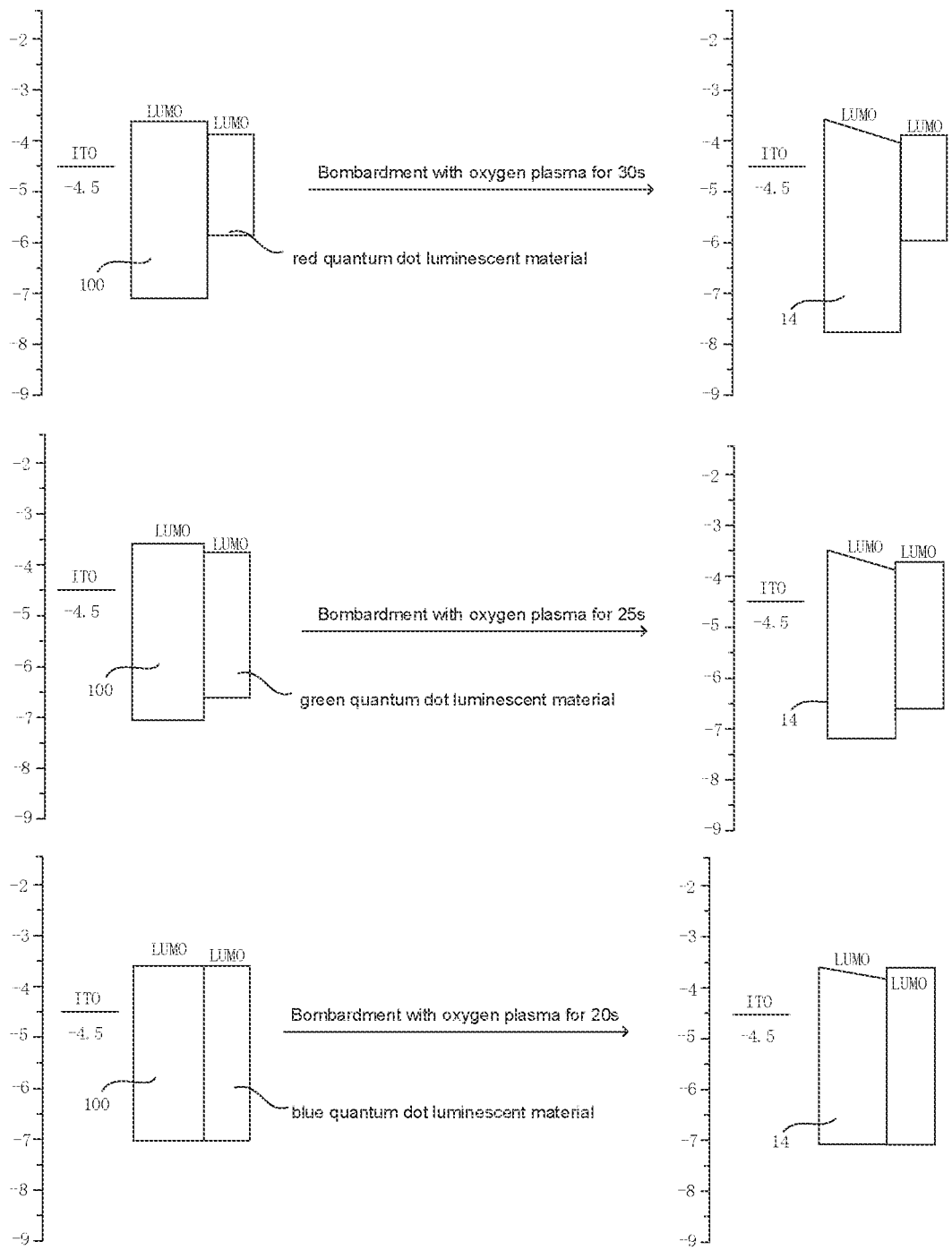
FIG. 12 is a diagram illustrating a change in LUMO energy level of the electron transport layer before and after bombardment with plasma, in accordance with some embodiments.

In step 4), the sacrificial film 201 exposed outside is bombard by using oxygen plasma to dry-etch the sacrificial film 201 to form the sacrificial layer 204, and after the dry-etch process is completed, portions of the film 100 having the electron transport function exposed outside are continuously bombarded by using the oxygen plasma for a first duration, so as to obtain ETLs 14. As shown in FIG. 12, the total bombardment duration is 30 s. Then a spin-coating liquid of a red quantum dot luminescent material is spin-coated, and after the spin-coating process is completed, the sacrificial layer is ultrasonically dissolved in ultra-dry ethanol to remove the sacrificial layer, so that the first patterned negative photoresist layer covering the sacrificial layer is removed together. In this way, preparation of red quantum dot light-emitting layers is completed.

In step 5), step 3) is repeated to obtain a second patterned negative photoresist layer (i.e., a photoresist layer 203). The second patterned negative photoresist layer exposes second portions of a sacrificial film 201, and the second portions of the sacrificial film 201 are portions of the sacrificial film 201 covering regions where the green quantum dot light-emitting devices are located.

In step 6), the sacrificial film 201 exposed outside is bombarded by using the oxygen plasma to dry-etch the sacrificial film 201 to form the sacrificial layer 204, and after the dry-etch process is completed, portions of the film 100 having the electron transport function exposed outside are continuously bombarded by using the oxygen plasma for a second duration, so as to obtain ETLs 14. As shown in FIG. 12, the total bombardment duration is 25 s. Then a spin-coating liquid of a green quantum dot luminescent material is spin-coated, and after the spin-coating process is completed, the sacrificial layer is ultrasonically dissolved in ultra-dry ethanol to remove sacrificial layer, so that the second patterned negative photoresist layer covering the sacrificial layer is removed together. In this way, preparation of green quantum dot light-emitting layers is completed.

In step 7), step 3) is repeated to obtain a third patterned negative photoresist layer (i.e., a photoresist layer 203). The third patterned negative photoresist layer exposes third portions of a sacrificial film 201, and the third portions of the sacrificial film 201 are portions of the sacrificial film 201 covering regions where the blue quantum dot light-emitting devices are located.

In step 8), the sacrificial film 201 exposed outside is bombarded by using the oxygen plasma to dry-etch the sacrificial film 201 to form the sacrificial layer 204, and after the dry-etch process is completed, portions of the film 100 having electron transport function exposed outside are continuously bombarded by using the oxygen plasma for a third duration, so as to obtain ETLs 14. As shown in FIG. 12, the total bombardment duration is 20 s. Then a spin-coating liquid of a blue quantum dot luminescent material is spin-coated, and after the spin-coating process is completed, the sacrificial layer is ultrasonically dissolved in ultra-dry ethanol for 90 s to remove the sacrificial layer, so that the third patterned negative photoresist layer covering the sacrificial layer is removed together. In this way, preparation of blue quantum dot light-emitting layers is completed.

In step 9), HTLs 15 and anodes (i.e., second electrodes 12) are sequentially formed on the base 2 on which the red quantum dot light-emitting layers, the green quantum dot light-emitting layers and the blue quantum dot light-emitting layers have been formed through evaporation processes, thereby completing preparation of a full-color light-emitting substrate.

Experimental Example 2

In the experimental example 1, it is detected by an ultraviolet photoelectron spectroscopy (UPS) method that the LUMO energy level of the film 100 having electron transport function is −3.6 eV. In step 4), after the bombardment is completed, it may be known through measurement that, on a side of the exposed portion of the film 100 having the electron transport function away from a surface of the cathode, and within a thickness range of less than or equal to 1 nm from the quantum dot light-emitting layer, a percentage of the number of oxygen vacancies in the number of lattice sites of oxygen atoms is 20%, and a LUMO energy level is −4.0V; on a side of the exposed portion of the film 100 having the electron transport function proximate to the surface of the cathode, and within a thickness range of less than or equal to 1 nm from the cathode, a percentage of the number of oxygen vacancies is 5%, and a LUMO energy level is −3.6 eV. In step 6), after the bombardment is completed, on the side of the exposed portion of the film 100 having the electron transport function away from the surface of the cathode, and within the thickness range of less than or equal to 1 nm from the quantum dot light-emitting layer, a percentage of the number of oxygen vacancies in the number of lattice sites of oxygen atoms is 12%, and a LUMO energy level is −3.9 eV; on the side of the exposed portion of the film 100 having the electron transport function proximate to the surface of the cathode, and within the thickness range of less than or equal to 1 nm from the cathode, a percentage of the number of oxygen vacancies in the number of lattice sites of oxygen atoms is 5%, and a LUMO energy level is −3.6 eV. In step 8), after the bombardment is completed, on the side of the exposed portion of the film 100 having the electron transport function away from the surface of the cathode, and within the thickness range of less than or equal to 1 nm from the quantum dot light-emitting layer, a percentage of the number of oxygen vacancies in the number of lattice sites of oxygen atoms is 9%, and a LUMO energy level is −3.8 eV; on the side of the exposed portion of the film 100 having the electron transport function proximate to the surface of the cathode, and within the thickness range of less than or equal to 1 nm from the cathode, a percentage of the number of oxygen vacancies in the number of lattice sites of oxygen atoms is 5%, and a LUMO energy level is −3.6 eV. In addition, correspondingly, a LUMO energy level of the red quantum dot light-emitting layer formed above is −3.8 eV, a LUMO energy level of the green quantum dot light-emitting layer formed above is −3.7 eV, and a LUMO energy level of the blue quantum dot light-emitting layer formed above is −3.6 eV.

A measurement principle of UPS is that ultraviolet light with single energy is used to irradiate a surface of a film under a vacuum of 10-7 Pa to 10-8 Pa, electrons on the surface are emitted after being collided by photons (the emitted electrons being generally referred to as photoelectrons), and an energy distribution of these photoelectrons is collected and analyzed to measure a LUMO energy level of a material having electron transport function.

It can be seen from the above that, as for light-emitting devices with different emission colors, in a case where a film having a certain LUMO energy level and electron transport function is used as an ETL, oxygen vacancies may be formed by using plasma in portions of the film having electron transport function located in regions where the light-emitting devices with different emission colors are located, and the LUMO energy levels of the portions of the film having electron transport function located in regions where the light-emitting devices with different emission colors are located may be adjusted. Therefore, the LUMO energy levels of the portions of the film having electron transport function located in regions where the light-emitting devices with different emission colors are located may be made to be matched with the LUMO energy levels of their respective corresponding EMLs, so that light-emitting devices with different emission colors may all have better device performance, and further a performance of the light-emitting substrate may be optimized.

The foregoing descriptions are merely some specific implementation manners of the present disclosure, but the protection scope of the present disclosure is not limited thereto, and changes or replacements that any person skilled in the art could conceive of within the technical scope disclosed by the present disclosure shall be within the protection scope of the present disclosure. Therefore, the protection scope of the present disclosure shall be subject to the protection scope of the claims.

What is claimed is:

1. A light-emitting device, comprising:
a first electrode and a second electrode that are superposed;
a light-emitting layer (EML) located between the first electrode and the second electrode; and
an electron transport layer (ETL) located between the first electrode and the EML, the ETL including a first surface proximate to the EML and a second surface proximate to the first electrode, and the ETL including oxygen vacancies, wherein a concentration of oxygen vacancies in the first surface is greater than a concentration of oxygen vacancies in the second surface.

2. The light-emitting device according to claim 1, wherein a concentration of the oxygen vacancies in the ETL gradually increases from the second surface to the first surface.

3. The light-emitting device according to claim 1, wherein a lowest unoccupied molecular orbital (LUMO) energy level of the first surface of the ETL is lower than a LUMO energy level of the second surface of the ETL;
an energy level difference between a LUMO energy level of the EML and the LUMO energy level of the first surface of the ETL is greater than 0 and less than or equal to 0.25 eV; and
an energy level difference between the LUMO energy level of the second surface of the ETL and a Fermi energy level of the first electrode is greater than 0 and less than or equal to 0.25 eV.

4. The light-emitting device according to claim 1, wherein in the ETL, a percentage of a number of oxygen vacancies in a number of lattice sites of oxygen atoms is in a range of 5% to 50% within a thickness range of 0 nm to 1 nm from the first surface, and a percentage of a number of oxygen vacancies in the number of lattice sites of oxygen atoms is in a range of 5% to 20% within a thickness range of 0 nm to 1 nm from the second surface.

5. The light-emitting device according to claim 4, wherein a concentration gradient X of oxygen vacancies in the ETL is represented by an amount of change in a percentage of a number of oxygen vacancies in the number of lattice sites of oxygen atoms in a thickness of two adjacent 1 nm in the ETL, and a value range of X satisfies a condition that X is greater than 0 and less than or equal to 0.9%.

6. The light-emitting device according to claim 1, wherein the ETL includes a metal oxide nanomaterial and at least one ligand bound to a metal atom in the metal oxide nanomaterial; each ligand is coordinated to one metal atom through at least one coordination group; and
a concentration of coordination groups in the ETL gradually decreases from the second surface to the first surface.

7. The light-emitting device according to claim 6, wherein the metal oxide nanomaterial includes magnesium-doped zinc oxide, wherein a doping amount of magnesium in zinc oxide is in a range of 5% to 40%.

8. The light-emitting device according to claim 1, wherein the EML is made of a quantum dot luminescent material.

9. A light-emitting substrate, comprising:
a base; and
a plurality of light-emitting devices disposed on the base, at least one light-emitting device being the light-emitting device according to claim 1, and the second electrode of the light-emitting device being closer to the base than the first electrode thereof.

10. A light-emitting apparatus, comprising the light-emitting device according to claim 1.

11. A method of manufacturing a light-emitting substrate, comprising:
forming a plurality of light-emitting devices on a base, wherein at least one light-emitting device is the light-emitting device according to claim 1, and the first electrode of the light-emitting device is closer to the base than the second electrode thereof.

12. The method of manufacturing the light-emitting substrate according to claim 11, wherein the plurality of light-emitting devices include N types of light-emitting devices with different emission colors, and N is an integer greater than or equal to 2; and
forming the plurality of light-emitting devices on the base includes:
forming a plurality of first electrodes on the base;
forming a film having electron transport function on the base on which the plurality of first electrodes have been formed;
forming an I-th mask on the base on which the film having the electron transport function has been formed, the I-th mask exposing portions of the film having the electron transport function located in regions where an I-th type of light-emitting devices are located, and covering a portion of the film having the electron transport function located in a region except the regions where the I-th type of light-emitting devices are located;
bombarding the portions of the film having the electron transport function located in the regions where the I-th type of light-emitting devices are located for an I-th duration by using plasma from a side of the film having the electron transport function away from the base, so that oxygen vacancies are formed in the portions of the film having the electron transport function located in the regions where the I-th type of light-emitting devices are located to obtain I-th ETLs;
forming I-th EMLs on a side of the I-th ETLs away from the base; and
removing the I-th mask; wherein
I is greater than or equal to 1, and less than or equal to N.

13. The method of manufacturing the light-emitting substrate according to claim 12, wherein
a LUMO energy level of the portions of the film having the electron transport function covering the regions where the I-th type of light-emitting devices are located is higher than a LUMO energy level of the I-th EMLs, and a LUMO energy level of surfaces of the I-th ETLs away from the base is lower than the LUMO energy level of the I-th EMLs;
or wherein
forming the I-th mask on the base on which the film having the electron transport function has been formed includes:
sequentially forming a sacrificial film and a photoresist film on the base on which the film having the electron transport function has been formed;
removing portions of the photoresist film covering the regions where the I-th type of light-emitting devices are located through exposure and development to obtain a photoresist layer;
bombarding the base on which the photoresist layer has been formed by using plasma, so as to remove portions of the sacrificial film covering the regions where the I-th type of light-emitting devices are located, and to obtain the I-th mask including the photoresist layer and a sacrificial layer;
bombarding the portions of the films having the electron transport function located in the regions where the I-th type of light-emitting devices are located for the I-th duration by using plasma from the side of the film having the electron transport function away from the base, includes: continuously bombarding the base for the I-th duration after removing the portions of the sacrificial film covering the regions where the I-th type of light-emitting devices are located, so as to form the I-th ETLs in the regions where the I-th type of light-emitting devices are located.

14. A light-emitting substrate, comprising:
a base; and
a plurality of light-emitting devices disposed on the base, at least one light-emitting device including:
a first electrode and a second electrode that are superposed, wherein the first electrode is closer to the base than the second electrode;
a light-emitting layer (EML) located between the first electrode and the second electrode; and
an electron transport layer (ETL) located between the first electrode and the EML, the ETL including a first surface proximate to the EML and a second surface proximate to the first electrode, and the ETL including oxygen vacancies, wherein a concentration of oxygen vacancies in the first surface is greater than a concentration of oxygen vacancies in the second surface.

15. The light-emitting substrate according to claim 14, wherein
the at least one light-emitting device includes at least two types of light-emitting devices with at least two emission colors, and each type of light-emitting devices emit light of one color; and
a material of each ETL of the at least two types of light-emitting devices includes magnesium-doped zinc oxide, and doping amounts of magnesium in zinc oxide are same or different in ETLs of light-emitting devices with different emission colors.

16. The light-emitting substrate according to claim 15, wherein
the doping amounts of magnesium in zinc oxide are same in the ETLs of the light-emitting devices with the different emission colors, and/or
concentrations of oxygen vacancies at least in first surfaces of the ETLs are different.

17. The light-emitting substrate according to claim 15, wherein
a doping amount of magnesium in zinc oxide is in a range of 5% to 40%, and/or
for the light-emitting devices with different emission colors, concentrations of oxygen vacancies of the ETLs are different.

18. The light-emitting substrate according to claim 14, wherein
the light-emitting substrate further comprises a pixel defining layer and a film having electron transport function located on a side of the pixel defining layer away from the base, and the pixel defining layer has a plurality of openings; and
the film having the electron transport function includes a portion located in each opening and a portion covering the pixel defining layer except for the openings, the portion of the film having the electron transport function located in each opening serves as the ETL, and a LUMO energy level of the portion of the film having the electron transport function covering the pixel defining layer except for the openings is higher than a LUMO energy level of a surface of the ETL away from the base.

19. A method of manufacturing a light-emitting device, comprising:
forming an electron transport layer (ETL) on a first electrode, oxygen vacancies being forming in the ETL, and a concentration of oxygen vacancies in a first surface being greater than a concentration of oxygen vacancies in a second surface, wherein the first surface is a surface of the ETL away from the first electrode, and the second surface is a surface of the ETL proximate to the first electrode;
forming a light-emitting layer (EML) on a side of the ETL away from the first electrode; and
forming a second electrode at a side of the EML away from the ETL.

20. The method of manufacturing the light-emitting device according to claim 19, wherein
forming the ETL on the first electrode includes:
forming a film having electron transport function on the first electrode, and bombarding the film having the electron transport function for a preset duration by using plasma from a side of the film having the electron transport function away from the first electrode, so as to form the oxygen vacancies in the film having the electron transport function to obtain the ETL.

* * * * *